(12) United States Patent
Luo et al.

(10) Patent No.: US 11,257,892 B2
(45) Date of Patent: Feb. 22, 2022

(54) LIGHT-EMITTING MODULE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yonghui Luo, Beijing (CN); Binfeng Feng, Beijing (CN)

(73) Assignees: Chengdu BOE Optoelectronics Technology Co., Ltd., Sichuan (CN); BOE Technology Group Co., Ltd., Beiiing (CN)

( * ) Notice: Subject to any disclaimer, the term of this patent is extended or adjusted under 35 U.S.C. 154(b) by 167 days.

(21) Appl. No.: 16/621,454

(22) PCT Filed: Jan. 10, 2019

(86) PCT No.: PCT/CN2019/071157
§ 371 (c)(1),
(2) Date: Dec. 11, 2019

(87) PCT Pub. No.: WO2019/218712
PCT Pub. Date: Nov. 21, 2019

(65) Prior Publication Data
US 2020/0227504 A1    Jul. 16, 2020

(30) Foreign Application Priority Data

May 18, 2018    (CN) .......................... 201810478201.0

(51) Int. Cl.
*H01L 27/32*    (2006.01)
*G06F 1/18*    (2006.01)
*H01L 51/00*    (2006.01)

(52) U.S. Cl.
CPC .......... *H01L 27/3276* (2013.01); *G06F 1/182* (2013.01); *H01L 27/323* (2013.01); *H01L 51/0097* (2013.01)

(58) Field of Classification Search
CPC ............... H01L 27/3276; H01L 27/323; H01L 51/0097; H01L 51/524; H01L 51/5237;
(Continued)

(56) References Cited

U.S. PATENT DOCUMENTS

2012/0062485 A1    3/2012    Kim
2018/0151655 A1*   5/2018    Kim .................... H01L 27/1218

FOREIGN PATENT DOCUMENTS

CN    203085099 U    7/2013
CN    103543867 A    1/2014
(Continued)

OTHER PUBLICATIONS

First Office Action for CN Appl. No. 201810478201.0, dated Mar. 26, 2019.
(Continued)

*Primary Examiner* — Kyoung Lee
(74) *Attorney, Agent, or Firm* — The Webb Law Firm

(57) ABSTRACT

This disclosure provides a light-emitting module and a display device. The light-emitting module includes: a body including a light-emitting panel and a cover plate located on a light emission side of the light-emitting panel; and a conductive layer arranged on a side of the body, the conductive layer having a part which is continuous from the cover plate to the light-emitting panel, wherein the conductive layer is grounded.

19 Claims, 4 Drawing Sheets

(58) Field of Classification Search
CPC ....... H01L 23/60; G06F 1/182; G06F 1/1601; Y02E 10/549; G09F 9/33
See application file for complete search history.

(56) References Cited

FOREIGN PATENT DOCUMENTS

| | | |
|---|---|---|
| CN | 105244343 A | 1/2016 |
| CN | 105572929 A | 5/2016 |
| CN | 206411363 U | 8/2017 |
| CN | 206460959 U | 9/2017 |
| CN | 108615749 A | 10/2018 |

OTHER PUBLICATIONS

Second Office Action for CN Appl. No. 201810478201.0, dated Oct. 9, 2019.

\* cited by examiner

LIGHT-EMITTING MODULE AND DISPLAY DEVICE

CROSS-REFERENCE TO RELATED APPLICATIONS

This application is a U.S. National Stage Application under 35 U.S.C. § 371 of International Patent Application No. PCT/CN2019/071157, filed on Jan. 10, 2019, which is based on and claims the priority of Chinese Patent Application No. 201810478201.0 filed on May 18, 2018, the disclosure of both which are incorporated by reference herein in entirety.

TECHNICAL FIELD

This disclosure relates to a light-emitting module and a display device.

BACKGROUND

Organic light-emitting diode (OLED for short) display device is a kind of self-luminous display device, and has advantages such as wider angle of view, higher contrast, faster response speed and lower power consumption than the liquid crystal display device. In addition, since the OLED display device does not need backlight, it can be manufactured relatively lighter and thinner.

With the development of the OLED display technology, more and more OLED display devices have been widely used in electronic devices as display panels. In OLED display devices of related technologies, the OLED module is one of important components.

SUMMARY

In an aspect of this disclosure, a light-emitting module is provided, including:

a body including a light-emitting panel and a cover plate located on a light emission side of the light-emitting panel; and a conductive layer arranged on a side of the body, the conductive layer having a part which is continuous from the cover plate to the light-emitting panel, wherein the conductive layer is grounded.

In some embodiments, the conductive layer overlies a peripheral contour of the body.

In some embodiments, the conductive layer is a conductive ink coated layer.

In some embodiments, the conductive layer further extends to a bottom surface of the body, and the bottom surface is located on a side of the light-emitting panel away from the cover plate.

In some embodiments, the bottom surface of the body includes a conductive surface layer, via which the conductive layer is grounded.

In some embodiments, the conductive layer completely overlies a part of a peripheral contour of the body from the cover plate to the bottom surface.

In some embodiments, the body further includes a touch sensor located between the cover plate and the light-emitting panel.

In some embodiments, the conductive layer is a hydrophobic conductive layer.

In some embodiments, the body further includes a decorative film arranged on a surface of a side of the cover plate adjacent to the light-emitting panel; and wherein a light shield layer or the conductive layer which is opaque is further provided on a part of the surface, and the part of the surface is located on an outer edge of the decorative film and is not overlain by the decorative film.

In some embodiments, the light-emitting panel is an organic light-emitting diode panel.

In some embodiments, the conductive layer overlies a peripheral contour of the body, and the conductive layer further extends to a bottom surface of the body and completely overlies a part of the peripheral contour of the body from the cover plate to the bottom surface, and the bottom surface is located on a side of the light-emitting panel away from the cover plate.

In another aspect of this disclosure, a display device is provided, including: the aforementioned light-emitting module.

In some embodiments, the display device further includes: a motherboard having a ground wire, and wherein the conductive layer in the light-emitting module is electrically connected with the ground wire.

In some embodiments, the display device further includes a flexible circuit board located between the bottom surface of the body and the motherboard, and wherein the conductive layer extends to a bottom surface of the body of the light-emitting module, and is electrically connected with the ground wire through a conductive surface layer on the bottom surface of the body and the flexible circuit board.

BRIEF DESCRIPTION OF THE DRAWINGS

Accompanying drawings which constitute a part of the specification describe the embodiments of this disclosure, and serve to explain the principle of this disclosure together with the description.

This disclosure can be understood more clearly with reference to the accompanying drawings according to the following detailed description, in which.

It should be noted that, the dimensions of the parts shown in the accompanying drawings are not drawn in accordance with actual proportional relationships. In addition, identical or similar reference numerals represent identical or similar composite parts.

DETAILED DESCRIPTION

Figure 1:
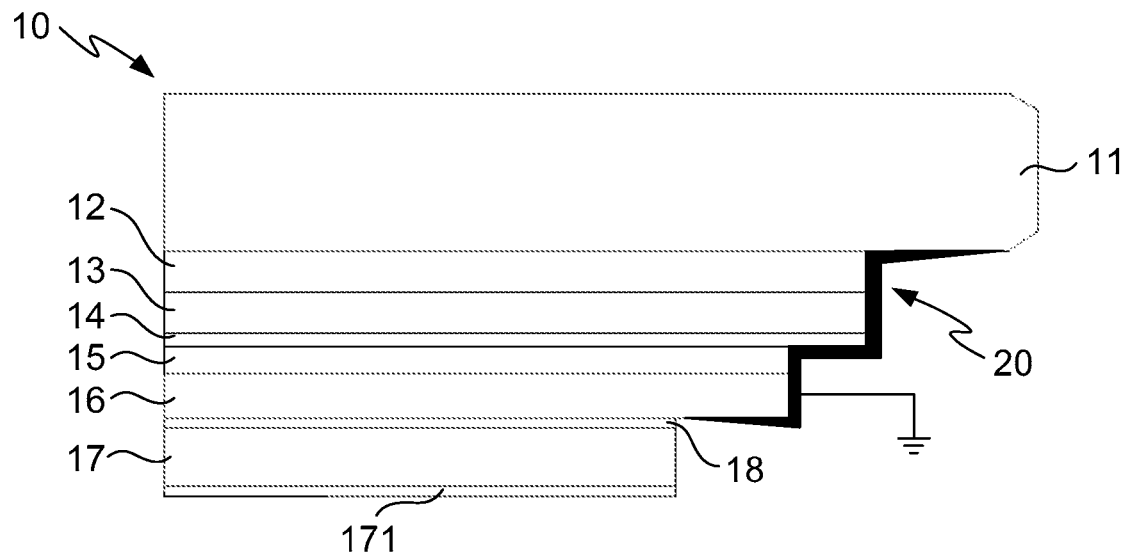
FIG. 1 is a schematic diagram showing a structure of an embodiment of the light-emitting module according to this disclosure.

The various exemplary embodiments of this disclosure are now described in detail with reference to the accompanying drawings. The description of the exemplary embodiment is merely illustrative and by no means serves as any restriction to this disclosure and its application or use. This disclosure can be implemented in many different forms and is not limited to the embodiments described here. These embodiments are provided in order to make this disclosure thorough and complete, and to fully express the scope of this disclosure to a person skilled in the art. It should be noted that, unless otherwise specified, the relative arrangements of the components described in these embodiments should be interpreted as merely illustrative but not restrictive.

The "first", "second" and similar words used in this disclosure do not imply any order, quantity or importance, but are used only to make a distinction between different parts. The "including", "comprising" and similar words mean that the element preceding the word covers the elements enumerated after the word and does not preclude the possibility that other elements are also covered. "up", "down", "left", "right" and so on are used only to represent relative position relationships, and when an absolute position of an object described changes, the relative position relationship may also change accordingly.

In this disclosure, when a particular device is described to be located between a first device and a second device, there may be an intermediary device between that particular device and the first device or the second device, or there may be no intermediary device therebetween. When a particular device is described to be connected to other devices, the particular device may be connected directly to the other devices without an intermediary device, or may be not directly connected to the other devices but have an intermediary device.

All terms (including technical terms or scientific terms) that are used in this disclosure have the same meaning as those understood by a person of ordinary skill in the field to which this disclosure pertains, unless otherwise specifically defined. It should also be understood that, terms defined in common dictionaries should be interpreted as having meanings consistent with their meanings in the context of the related technologies, rather than being interpreted in an idealized or extremely formalized sense, unless expressly defined here.

The technologies, methods and apparatuses known to those skilled in the related fields may not be discussed in detail, but where appropriate, the techniques, methods and apparatuses should be considered as part of the specification.

The inventors found that in some related technologies, when the OLED module is used, a certain amount of electrostatic charges will be accumulated on the cover plate, and the electrostatic charges will also flow along the peripheral contour of the OLED module. When the electrostatic charges flow to sides of the OLED panel in the OLED module, they may adversely affect the OLED panel, such as damaging the OLED panel structure or destroying the drive circuit of the OLED panel, etc. In addition, the OLED module may also receive electrostatic charges emitted into the sides of the OLED module in the environment, and these electrostatic charges will also adversely affect the OLED panel.

In view of this, the embodiments of this disclosure provide a light-emitting module and a display device, capable of improving the anti-ESD capability.

FIG. 1 is a schematic diagram showing a structure of an embodiment of the light-emitting module according to this disclosure.

In FIG. 1, the light-emitting module includes a body 10 and a conductive layer 20. In some embodiments, the body 10 includes a light-emitting panel 16 and a cover plate 11 located on a light emission side of the light-emitting panel 16. The light-emitting panel 16 is used to emit light for displaying image. The material of the cover plate 11 may include glass or plastic etc., and the cover plate 11 is arranged on the light emission side of the light-emitting panel 16, for packaging and protecting other components of the light-emitting module. For example, in FIG. 1, the light emission side of the light-emitting panel 16 is located on an upper side of the light-emitting panel 16, so the cover plate 11 is arranged on the upper side of the light-emitting panel 16. In addition, depending on the orientation of the light-emitting module and the shape of the light-emitting module, the light emission side of the light-emitting panel 16 can also be a lower side, an outer side, or an inner side of the light-emitting panel.

In some other embodiments, the light-emitting panel 16 can have multiple light emission sides directing to different directions. Accordingly, one or more cover plates 11 can be provided to be located in part or all of the multiple light emission sides.

Refer to FIG. 1, in some embodiments, the conductive layer 20 is grounded and arranged on the side of the body 10. Furthermore, the conductive layer 20 has a part which is continuous from the cover plate 11 to the light-emitting panel 16. This can enable the electrostatic charges accumulated on the cover plate 11 and the electrostatic charges on the side of the body to be effectively released through grounding of the conductive layer 20, so as to avoid or reduce the adverse effects of electrostatic discharge to the light-emitting panel, and improve the anti-electrostatic discharge capacity of the light-emitting module. In some embodiments, the grounding mode of conductive layer 20 can include providing a line or a conductive device on the conductive layer 20, and the line or the conductive device can guide the electrostatic charges to the ground wire.

In FIG. 1, in addition to the light-emitting panel 16 and the cover plate 11, the body 10 of the light-emitting module in the embodiment of this disclosure may further include a polarizer 13, a touch sensor 14 and a foam 17. The foam 17 is located on the bottom surface of the body 10, for absorbing shock of the light-emitting module. A grid glue 18 can be used for fixing between the foam 17 and the light-emitting panel 16. The light emission side of the light-emitting panel 16 can be also provided with the touch sensor 14, and the polarizer 13 can be arranged on a side of the touch sensor 14 away from the light-emitting panel 16. Between the cover plate 11 and the polarizer 13, as well as between the touch sensor 14 and the light-emitting panel 16, optically clear adhesives (OCA for short) 12 and 15 can be used for fixing, respectively. In some other embodiments, the body 10 of the light-emitting module can also include different components, and adopt different position settings and connection relationships according to actual use needs.

Since the touch sensor 14 is located between the cover plate 11 and the light-emitting panel 16, and the part of the conductive layer 20 from the cover plate 11 to the light-emitting panel 16 is continuous, the touch sensor 14 is therefore also in the range of the conductive layer 20, which reduces or avoids as far as possible the adverse effects caused by the entry of the electrostatic charges from the sides of the touch sensor 14 with respect to the touch sensor 14, e.g., failure or damage of the touch sensor.

In some embodiments, the conductive layer can be partially or fully in contact with the peripheral contour of the body 10, and effectively releases the electrostatic charges by means of grounding. Refer to FIG. 1, in some other embodiments, the conductive layer 20 can overlie the peripheral contour of the body, which can not only release the electrostatic charges of the cover plate 11 by means of grounding, but also reduce or avoid flowing of the electrostatic charges in a gap between the conductive layer and body 10, so as to more efficiently suppress the adverse effects caused by electrostatic discharge to the light-emitting module.

In the embodiments of the light-emitting module, the light-emitting panel 16 can adopt an OLED panel. In some other embodiments, the light-emitting panel 16 can also be a light-emitting diode (LED for short) panel or a quantum dot light-emitting diode (QLED for short) panel, etc.

In order to arrange the conductive layer on the peripheral contour of the body 10, it can be adhered to the peripheral contour by means of a conductive tape, a conductive film and so on. Refer to FIG. 1, in some embodiments, a conductive ink coated layer can be used as the conductive layer, i.e., spraying the conductive ink onto the peripheral contour of the body 10. The formed conductive ink coated layer not only can be tightly adhered to the peripheral contour of the body 10, but also has a good electrical conductivity. In addition, such a way of forming the conductive layer 20 is more convenient, and the formed conductive layer is also more secure.

In selecting the material of the conductive layer, in addition to the consideration of the electrical conductivity, other performances can also be taken into account according to actual needs. For example, if the light-emitting module is used in a comparatively humid environment, a hydrophobic conductive layer that is water-repellent can be adopted. For the conductive ink coated layer mentioned above, a hydrophobic conductive ink can be used to be sprayed onto the peripheral contour of the body 10 to form the hydrophobic conductive layer.

When the hydrophobic conductive layer forms a seal for part or all of the peripheral contour of the body 10, it can effectively block moisture in the environment from entering, thus improving adaptability of the light-emitting module in the humid environment, and also improving the ability of passing the reliability test of the light-emitting module in the high temperature and high humidity environment.

Figure 2:
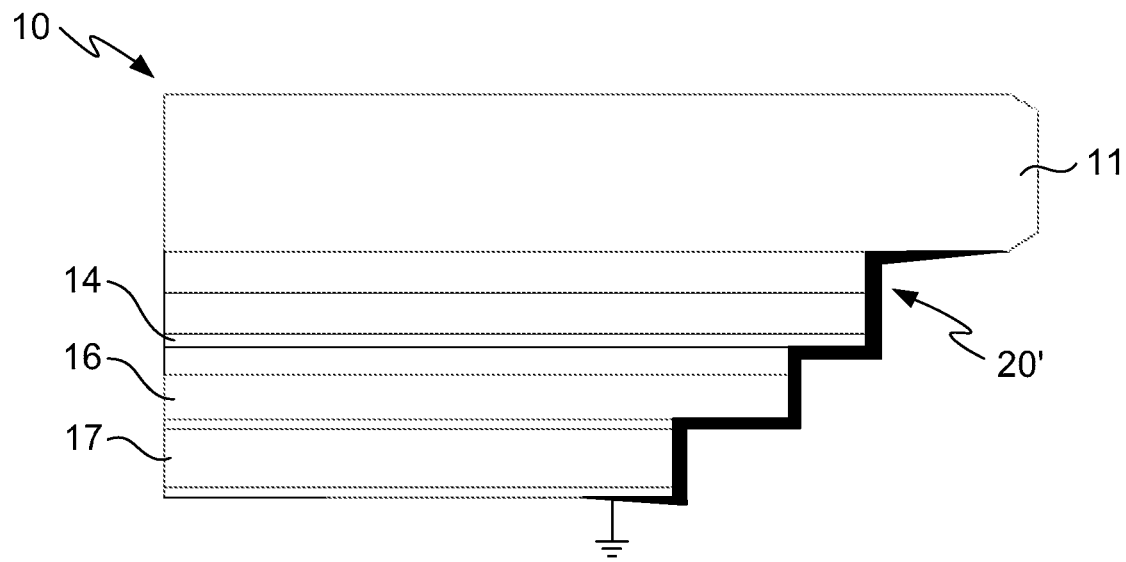
FIG. 2 is a schematic diagram showing a structure of another embodiment of the light-emitting module according to this disclosure.

FIG. 2 is a schematic diagram showing a structure of another embodiment of the light-emitting module according to this disclosure.

In FIG. 2, the conductive layer 20' further extends from the light-emitting panel 16 to a bottom surface of the body 10. The bottom surface is on a side of the light-emitting panel 16 away from the cover plate 11 (i.e., a side opposite to the light emission side, corresponding to the lower side of FIG. 2). In this way, the conductive layer 20' can achieve more choices of the grounding position, such as grounding on the bottom surface, to reduce a lateral space occupied by the side grounding.

In order to facilitate the arrangement of the grounding on the side of the bottom surface, the bottom surface of the body 10 may include a conductive surface layer 171. The conductive layer 20' can be grounded via the conductive surface layer 171. The conductive surface layer 171 may include a metal layer formed by pasting or electroplating, such as a metal foil layer arranged on a lower surface of the foam 17. In some other embodiments, the conductive surface layer 171 can also include a further extension of the conductive layer 20' on the bottom surface of the body 10, that is, the conductive surface layer 171 includes the part of the conductive layer 20' on the bottom surface of the body 10.

In this way, when the conductive layer 20' fully overlies the part of the peripheral contour of the body 10 from the cover plate 11 to the bottom surface, it can provide a more comprehensive electrostatic discharge protection effect to the light-emitting module. In some embodiments on this basis, the conductive layer 20' is a hydrophobic conductive layer, which can effectively and comprehensively block the moisture from entering the light-emitting module, thus making the light-emitting module attain a better environmental adaptability.

Figure 3:
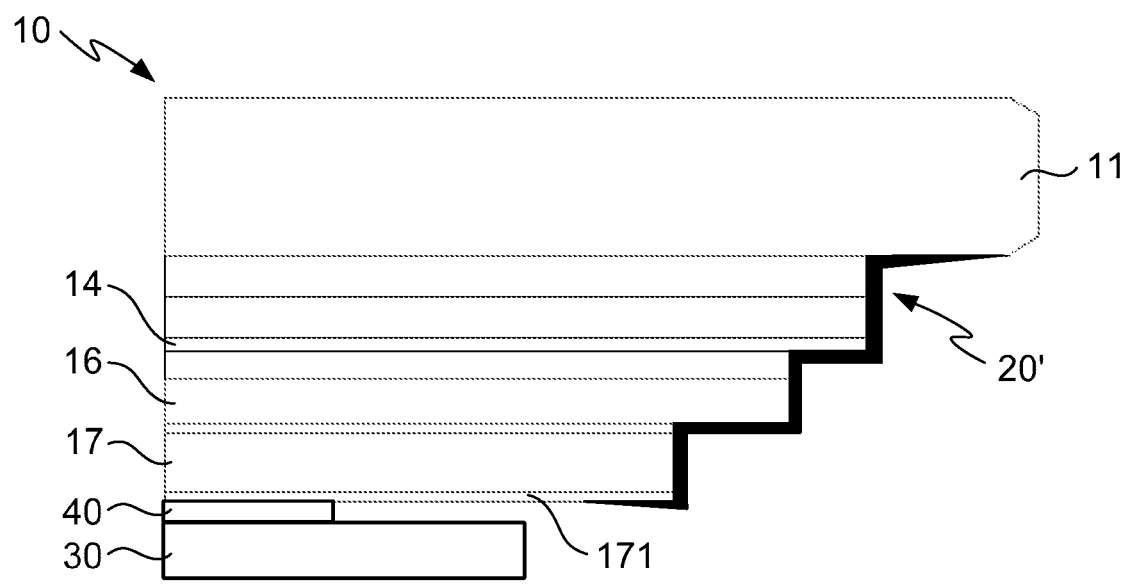
FIG. 3 is a schematic diagram showing a structure of an embodiment of the display device according to this disclosure.

FIG. 3 is a schematic diagram showing a structure of an embodiment of the display device according to this disclosure.

In FIG. 3, the display device includes a light-emitting module and a motherboard 30 with a ground wire. The conductive layer 20' in the light-emitting module is electrically connected with the ground wire. The connection between the conductive layer 20' and the ground wire of the motherboard 30 can be realized by any form of electrical connector or circuit, for example, the flexible circuit board 40 shown in FIG. 3. In FIG. 3, the motherboard 30 can be located on the side opposite to the light emission side of the light-emitting panel 16. Moreover, the motherboard 30 can be also arranged on the peripheral side of the light-emitting module as needed. By reasonably setting the grounding position of the motherboard 30 and the conductive layer 20', a display device which is more reasonable and compact in structure can be obtained.

Refer to FIG. 3, the flexible circuit board 40 is located between the bottom surface of the body 10 and the motherboard 30. Since the conductive layer 20' extends to the bottom surface of the body 10 of the light-emitting module, the conductive layer 20' can be electrically connected with the ground wire through the conductive surface layer 171 on the bottom surface of the body 10 and the flexible circuit board 40. Specifically, the conductive surface layer 171 can be in contact and connected with a exposed copper at an end of the flexible circuit board 40 through a conductive double-sided adhesive, while another end of the flexible circuit board 40 is connected on the motherboard 30 and is electrically connected directly or indirectly with the ground wire of the motherboard 30.

Figure 4:
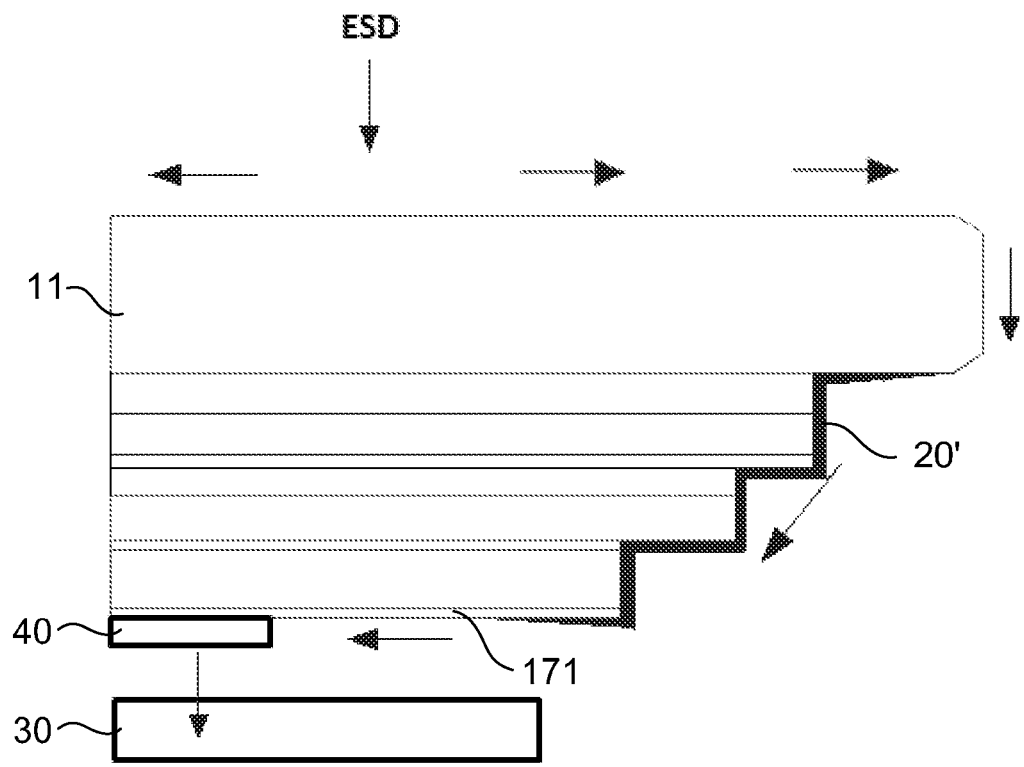
FIG. 4 is a schematic diagram showing a process in which the electrostatic charges are grounded and released during the ESD test, according to the embodiment in FIG. 3.

FIG. 4 is a schematic diagram showing a process in which the electrostatic charges are grounded and released during the ESD test, in the embodiment of FIG. 2.

Refer to FIG. 4, by taking the ESD test as an example, the solid arrows in FIG. 4 illustratively show the flowing direction of the electrostatic charges in the embodiment of the display device according to this disclosure. After the electrostatic charges are emitted to the surface of cover plate 11, they flow around along the surface of the cover plate 11. The electrostatic charges enter the conductive layer 20' when flowing to the lateral or lower surface of the cover plate 11, and flow along the conductive layer 20' to the bottom surface of the body 10 of the light-emitting module. Then, the electrostatic charges flow through the conductive surface layer 171, the flexible circuit board 40 to the motherboard 30, and are released through the ground wire of the motherboard 30.

Figure 5:
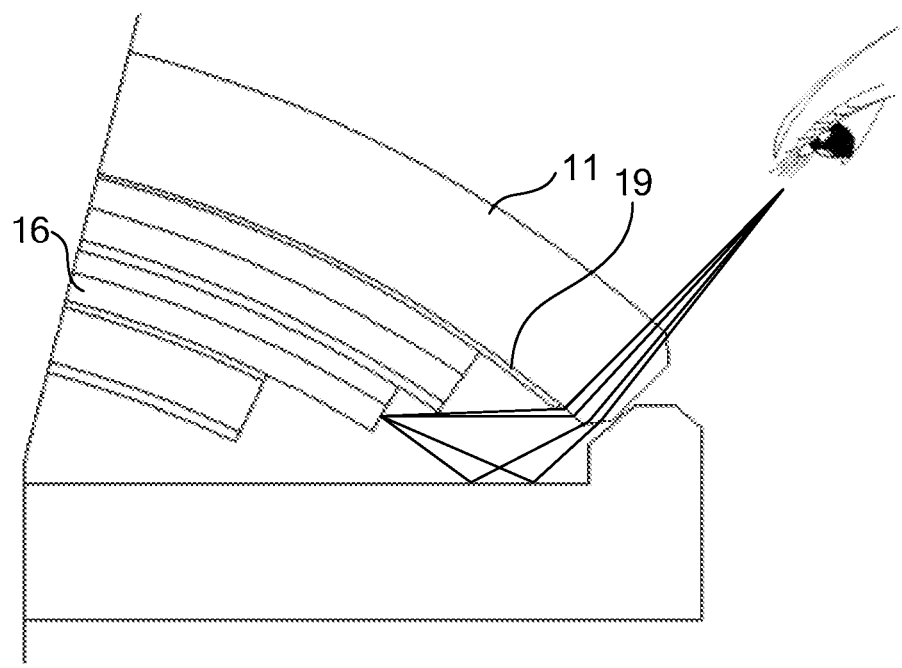
FIG. 5 is a schematic diagram showing a light path of the light-emitting module.

FIG. 5 is a schematic diagram showing a light path of the light-emitting module.

Refer to FIG. 5, the cover plate 11 of the light-emitting module is also provided with a decorative film (DECO FILM) 19, on a surface of a side adjacent to the light-emitting panel 16. The decorative film is mainly used to protect circuit elements on a side of the decorative film away from the cover plate 11, e.g., the light-emitting panel 16 or the touch sensor 14. In addition, the decorative film can mask the internal circuits of the light-emitting module.

As to the embodiment of the display device shown in FIG. 5, due to process limitations, it is not easy for the decorative film 19 to be completely flush with the edge of the cover plate 11 when affixed to the cover plate 11, so a part not overlain by the decorative film 19 will possibly be retained. In this way, when the human eyes watch the display device, the light emitted from the sides of the light-emitting panel 16 may enter the human eyes through that part, thus resulting in a visual effect of bright lines on the edge of the display device.

Figure 6:
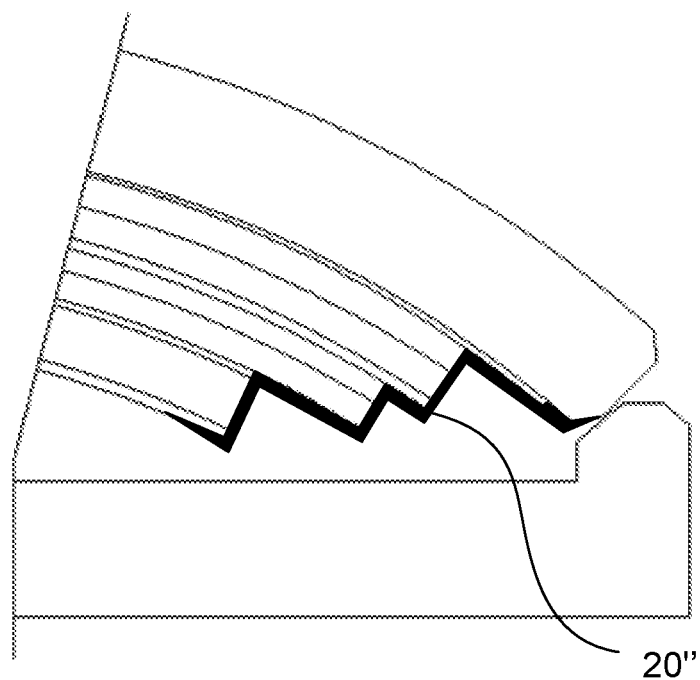
FIG. 6 is a schematic diagram showing a structure of a further embodiment of the display device according to this disclosure.

FIG. 6 is a schematic diagram showing a further embodiment of the display device according to this disclosure.

Refer to FIG. 6, a conductive layer 20" which is opaque can be arranged on a surface of a side of the cover plate 11 of the light-emitting module adjacent to the light-emitting panel 16. That is, the conductive layer 20" extends to overlie the part located on the outer edge of the decorative film 19, and not overlain by the decorative film 19. In this way, in the formation of the conductive layer 20", the effect of edge shielding can be achieved together, and the visual effect of bright lines on the edge of the display device can also be eliminated. In order to make the conductive layer 20" opaque, a black or dark conductive ink can be selected. In this way, when the conductive ink is sprayed to the outer edge of the decorative film 19, it can achieve a good light shielding effect.

Figure 7:
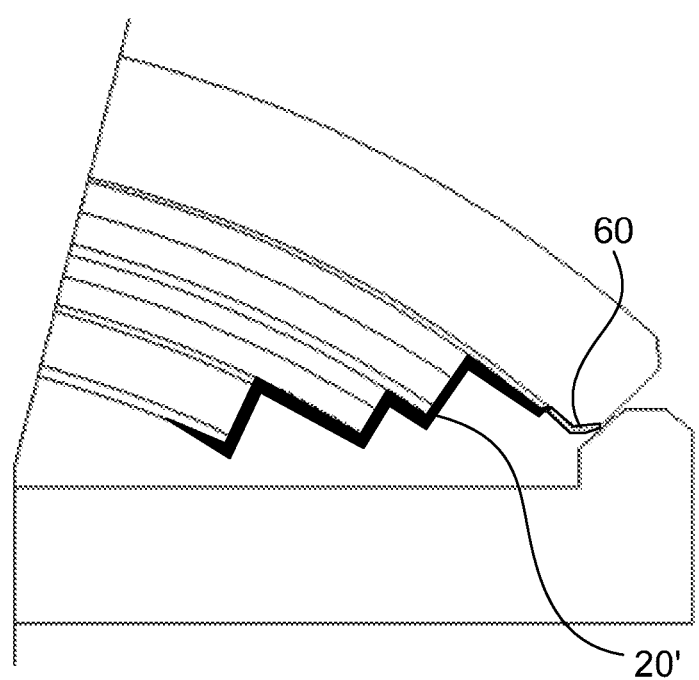
FIG. 7 is a schematic diagram showing a structure of still another embodiment of the display device according to this disclosure.

FIG. 7 is a schematic diagram showing still another embodiment of the display device according to this disclosure.

Refer to FIG. 7, a light shield layer 60 can also be arranged on a surface of a side of the cover plate 11 of the light-emitting module 11 adjacent to the light-emitting panel 16. The light shield layer 60 can be arranged on the part located on the outer edge of the decorative film 19, and not overlain by the decorative film 19. The light shield layer 60 may partially overlap or not overlap with the decorative film 19 in the thickness direction. The light shield layer 60 may at least partially overlap or not overlap with the part of the conductive layer 20' on the cover plate 11. The light shield layer 60 can adopt any material or structure capable of shielding light, such as black tape or metal coated layer with a certain thickness.

Through the light shielding effect of the light shield layer 60, the light emitted from the sides of the light-emitting panel will not emerge from the edge of the display device, thus eliminating the visual effect of bright lines on the edge of the display device.

The various embodiments of the light-emitting module can be applied not only to the display device, but also to other fields such as lighting devices. Display devices may be: mobile phones, tablets, television sets, monitors, laptops, digital photo frames, navigators and any other products or components with display capabilities. In addition, the various components included in the light-emitting module shall be selected and set according to functions realized thereby, and are not limited only to the specific structures involved in the various embodiments of this disclosure.

So far, the various embodiments of this disclosure have been described in detail. In order to avoid shielding the idea of this disclosure, some of the details well known in the art are not described. Those skilled in the art can fully understand how to implement the technical solutions disclosed here according to the above description.

Although some specific embodiments of this disclosure have been described in detail by way of examples, those skilled in the art should understand that the above examples are for illustrative purposes only, but not for limiting the scope of this disclosure. Those skilled in the art should understand that the above embodiments can be modified or some technical features can be equivalently replaced without departing from the scope and spirit of this disclosure. The scope of this disclosure is limited by the attached claims.

What is claimed is:

1. A light-emitting module, comprising:
   a body comprising a light-emitting panel and a cover plate located on a light emission side of the light-emitting panel; and
   a conductive layer arranged on a side of the body, the conductive layer having a part which is continuous from the cover plate to the light-emitting panel, wherein the conductive layer is grounded, the conductive layer further extends to a bottom surface of the body, and the bottom surface is located on a side of the light-emitting panel away from the cover plate.

2. The light-emitting module according to claim 1, wherein the conductive layer overlies a peripheral contour of the body.

3. The light-emitting module according to claim 2, wherein the conductive layer is a conductive ink coated layer.

4. The light-emitting module according to claim 1, wherein the bottom surface of the body comprises a conductive surface layer, via which the conductive layer is grounded.

5. The light-emitting module according to claim 1, wherein the conductive layer completely overlies a part of a peripheral contour of the body from the cover plate to the bottom surface.

6. The light-emitting module according to claim 1, wherein the body further comprises:
   a touch sensor located between the cover plate and the light-emitting panel.

7. The light-emitting module according to claim 1, wherein the conductive layer is a hydrophobic conductive layer.

8. The light-emitting module according to claim 1, wherein the body further comprises:
   a decorative film arranged on a surface of a side of the cover plate adjacent to the light-emitting panel; and
   wherein a light shield layer is further provided on a part of the surface, and the part of the surface is located on an outer edge of the decorative film and is not overlain by the decorative film.

9. The light-emitting module according to claim 1, wherein the light-emitting panel is an organic light-emitting diode panel.

10. The light-emitting module according to claim 7, wherein the conductive layer overlies a peripheral contour of the body, and the conductive layer further extends to a bottom surface of the body located on a side of the light-emitting panel away from the cover plate, and completely overlies a part of the peripheral contour of the body from the cover plate to the bottom surface.

11. A display device comprising: the light-emitting module according to claim 1.

12. The display device according to claim 11, further comprising:
   a motherboard having a ground wire; and
   wherein the conductive layer in the light-emitting module is electrically connected with the ground wire.

13. The display device according to claim 12, further comprising:

a flexible circuit board, located between the bottom surface of the body and the motherboard; and wherein the conductive layer extends to a bottom surface of the body of the light-emitting module, and is electrically connected with the ground wire through a conductive surface layer on the bottom surface of the body and the flexible circuit board.

14. The light-emitting module according to claim 1, wherein the body further comprises:

a decorative film arranged on a surface of a side of the cover plate adjacent to the light-emitting panel; and wherein the conductive layer is opaque and further provided on a part of the surface, and the part of the surface is located on an outer edge of the decorative film and is not overlain by the decorative film.

15. A display device comprising: the light-emitting module according to claim 2.

16. A display device comprising: the light-emitting module according to claim 4.

17. A display device comprising: the light-emitting module according to claim 5.

18. A display device comprising: the light-emitting module according to claim 7.

19. A display device comprising: the light-emitting module according to claim 14.

* * * * *

UNITED STATES PATENT AND TRADEMARK OFFICE
CERTIFICATE OF CORRECTION

| | |
|---|---|
| PATENT NO. | : 11,257,892 B2 |
| APPLICATION NO. | : 16/621454 |
| DATED | : February 22, 2022 |
| INVENTOR(S) | : Luo et al. |

Page 1 of 1

It is certified that error appears in the above-identified patent and that said Letters Patent is hereby corrected as shown below:

On the Title Page

Column 1, item (73) Assignees, Line 4, delete "Beiiing" and insert -- Beijing --

Signed and Sealed this
Twenty-sixth Day of April, 2022

Katherine Kelly Vidal
*Director of the United States Patent and Trademark Office*